United States Patent
Ni (10) Patent No.: US 11,187,996 B2
(45) Date of Patent: Nov. 30, 2021

(54) EXPOSURE METHOD AND EXPOSURE DEVICE THEREOF

(71) Applicants: CHONGQING HKC OPTOELECTRONICS TECHNOLOGY CO., LTD., Chongqing (CN); HKC CORPORATION LIMITED, Shenzhen (CN)

(72) Inventor: Wei Ni, Chongqing (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 392 days.

(21) Appl. No.: 16/311,666

(22) PCT Filed: Oct. 22, 2018

(86) PCT No.: PCT/CN2018/111191
§ 371 (c)(1),
(2) Date: Dec. 19, 2018

(87) PCT Pub. No.: WO2020/051978
PCT Pub. Date: Mar. 19, 2020

(65) Prior Publication Data
US 2021/0232053 A1    Jul. 29, 2021

(30) Foreign Application Priority Data
Sep. 14, 2018  (CN) .......................... 201811071348.4

(51) Int. Cl.
*G03F 7/20* (2006.01)

(52) U.S. Cl.
CPC ................. *G03F 7/70641* (2013.01)

(58) Field of Classification Search
CPC ... G03F 7/70641; G03F 9/7084; G03F 9/7007
See application file for complete search history.

(56) References Cited

U.S. PATENT DOCUMENTS

| | | | |
|---|---|---|---|
| 2006/0292463 A1 | 12/2006 | Best et al. | |
| 2010/0128239 A1* | 5/2010 | Iino ........................ | G03F 9/7084 355/67 |
| 2012/0269552 A1* | 10/2012 | Sato ................. | G03G 15/04054 399/177 |

FOREIGN PATENT DOCUMENTS

| CN | 102023493 A | 4/2011 |
|---|---|---|
| CN | 102681350 A | 9/2012 |
| CN | 103034071 A | 4/2013 |
| CN | 103270454 A | 8/2013 |

(Continued)

OTHER PUBLICATIONS

Jing An, the ISA written comments, dated Jun. 2019, CN.

*Primary Examiner* — Steven Whitesell Gordon (57) ABSTRACT

The present application discloses an exposure method and an exposure device thereof. The method includes the following steps: confirming a position of a point to be exposed; capturing and confirming that the point to be exposed is successfully captured; adjusting a light source corresponding to the successfully captured point to be exposed to an adaptive position; and completing an exposure operation by an exposure machine.

14 Claims, 5 Drawing Sheets

(56) References Cited

FOREIGN PATENT DOCUMENTS

| | | | |
|---|---|---|---|
| CN | 105467773 | A | 4/2016 |
| CN | 105892237 | A | 8/2016 |
| CN | 106292203 | A | 1/2017 |

* cited by examiner

EXPOSURE METHOD AND EXPOSURE DEVICE THEREOF

The present application claims priority to the Chinese Patent Application No. CN201811071348.4, filed to the Chinese Patent Office on Sep. 14, 2018, and entitled "EXPOSURE METHOD AND EXPOSURE DEVICE THEREOF", which is incorporated herein by reference in its entirety.

TECHNICAL FIELD

The present disclosure relates to the technical field of display, and in particular, to an exposure method and an exposure device thereof.

BACKGROUND

It should be understood that the statements herein merely provide background information related to the present application, and do not necessarily constitute the prior art.

With the development and advancement of science and technology, liquid crystal displays have become mainstream products of displays due to their thin body, low power consumption and low radiation, and thus have been widely used. Most liquid crystal displays currently available on the market are backlight type liquid crystal displays, which include a liquid crystal panel and a backlight module. The working principle of the liquid crystal panel is to place liquid crystal molecules in two parallel glass substrates, and apply a driving voltage on the two glass substrates to control the rotation direction of the liquid crystal molecules to refract the light of the backlight module to generate a picture.

Thin Film Transistor-Liquid Crystal Display (TFT-LCD) has gradually become a leading role in the display field due to its low power consumption, excellent picture quality, and higher production yield. Similarly, the TFT-LCD includes a liquid crystal panel and a backlight module. The liquid crystal panel includes a Color Film Substrate (CF Substrate) (also called a color filter substrate) and a TFT substrate, and a mask, and transparent electrodes exist on the opposite inner side of the foregoing substrates. A Liquid Crystal (LC) molecule layer is sandwiched between two substrates.

In the manufacturing process of the display panel, there are many processes that need to be exposed. A method known to the inventors is to use an exposure machine; however, the exposure machine has a long pitch time of exposure, and the alignment precision of the product is poor.

TECHNICAL SOLUTIONS

The technical problem to be solved by the present disclosure is to provide a method capable of reducing the pitch time of exposure of the exposure machine and improving the alignment precision of the product.

To achieve the foregoing objective, the present disclosure provides an exposure method, including the following steps:

confirming a position of a point to be exposed in a region to be exposed;

capturing the point to be exposed, and confirming that the point to be exposed is successfully captured;

adjusting a light source corresponding to the successfully captured point to be exposed to an adaptive position; and completing an exposure operation by an exposure machine.

Optionally, the step of confining a position of a point to be exposed in a region to be exposed includes:

confirming that the point to be exposed is located at a central position of a capture visual field.

In this solution, if the point to be exposed is not located at the central position of the capture visual field, the time of capturing the point to be exposed would be prolonged. Therefore, by means of an operation of confirming and adjusting the point to be exposed so that the point to be exposed is located at the center of the capture visual field, this solution can increase the capture success rate of the point to be exposed to advance the production process and reduce the capture time, so as to reduce the production time of a single product and improve the production efficiency.

Optionally, the step of confirming a position of a point to be exposed in a region to be exposed further includes: after confirming that the point to be exposed is located at the central position of the capture visual field, adjusting a lens to focus if the point to be exposed is displayed obscurely until the point to be exposed is displayed in an optimal clear state.

In this solution, if the point to be exposed is obscure, the central point will offset during capture, and as a result, the alignment precision of the product is poor. However, by means of the operations of first confirming and adjusting the point to be exposed, adjusting the lens to focus after the point to be exposed is located at the central position of the capture visual field, and confirming that the point to be exposed is in the optimal clear state, this solution can not only improve the focus success rate to save the focus time, but also increases the capture success rate to advance the production process and reduce the capture time, so as to reduce the production time of a single product and improve the production efficiency, and it is beneficial to ensure the alignment precision of the product, and thus improving the product yield.

Optionally, the step of capturing the point to be exposed, and confirming that the point to be exposed is successfully captured further includes: attempting, by the lens, to automatically capture the point to be exposed, and confirming successful capture; and capturing the point to be exposed for many times, and confirming the number of captures.

In this solution, after the position of the light source of the exposure machine is already adjusted, the point to be exposed is captured using an automatic capture function of the exposure machine. Although the capture is not carried out in the optimal capture condition, it is still possible to successfully capture the point to be exposed. Such operation can prevent wasting the opportunities of capture when other steps are carried out, which is beneficial to speed up the process of capture. In addition, the confirming the number of captures is beneficial to provide experience so that subsequent capture operations can learn from the operation of less number of captures to improve the capture success rate and the capture efficiency.

Optionally, the step of adjusting a light source corresponding to the successfully captured point to be exposed to an adaptive position further includes: individually configuring a set of light sources for each region to be exposed; sequentially adjusting the light sources for each region to be exposed; repeatedly adjusting to find the optimal light source; calculating a triple standard deviation of a measurement value of the optimal light source; and when the triple standard deviation is less than 2 μm, completing the exposure operation by the exposure machine using an exposure mask.

In this solution, in consideration of the existing mode of the exposure machine on the market that a set of light sources are shared by regions to be exposed, as a result, the light source of the point to be exposed is poor, which is not conducive to the capture of the point to be exposed and prolongs the pitch time of exposure; using the same set of light sources will cause the brightness of one of the regions to be exposed to be better, while the light effect of other regions to be exposed is poor, which will affect the product and even decline the quality of the product. However, in this solution, the mode of individually using a set of light sources in each region to be exposed can optimize the light source environment of each region to be exposed. In this way, the light sources can be sequentially adjusted for each region to be exposed, and are repeatedly adjusted to find the optimal light source of each region to be exposed. A triple standard deviation of a measurement value of the optimal light source is calculated, and when the triple standard deviation is less than 2 μm, the requirements are met, and the exposure machine completes the exposure operation. For each region to be exposed, after the optimal light source needed by each region to be exposed is found, the point to be exposed and the obscure degree would be adjusted more easily under the optimal light source, and moreover, the sharpness of the product is increased, the pitch time of the exposure machine and the alignment precision of the product are further improved, and the product yield is increased.

Optionally, the region to be exposed is a region on a substrate corresponding to the size of the exposure mask; and the substrate is divided into at least two regions to be exposed.

In this solution, the region to be exposed is a region on a substrate corresponding to the size of the exposure mask; the substrates have different sizes according to the design of the mask; the substrate is divided into at least two regions to be exposed; all the regions to be exposed constitute the entire substrate; the light sources are adjusted for each region to be exposed so that the parts of the substrate are perfected so that the entire substrate is exposed better after the exposure operation is completed.

Optionally, the substrate is divided into six regions to be exposed.

In this solution, the substrate is divided into six regions to be exposed; and the six regions to be exposed constitute an entire substrate. Dividing a substrate into six regions to be exposed enables the light source to be adjusted accurately, and therefore, the light irradiation is concentrated, and the entire substrate is exposed better after the exposure operation is completed.

The present disclosure further provides an exposure method, including the following steps:

confirming that a point to be exposed is located at a central position of a capture visual field;

after confirming that the point to be exposed is located at the central position of the capture visual field, adjusting a lens to focus if the point to be exposed is displayed obscurely until the point to be exposed is displayed in an optimal clear state;

attempting, by the lens, to automatically capture the point to be exposed, and confirming successful capture;

capturing the point to be exposed for many times, and confirming the number of captures;

individually configuring a set of light sources for each region to be exposed, sequentially adjusting the light sources for each region to be exposed, and repeatedly adjusting to find the optimal light source; and calculating a triple standard deviation of a measurement value of the optimal light source; and when the triple standard deviation is less than 2 μm, completing an exposure operation by the exposure machine using an exposure mask.

In this solution, if the point to be exposed is not located at the central position of the capture visual field, the time of capturing the point to be exposed would be prolonged. Therefore, by means of an operation of confirming and adjusting the point to be exposed so that the point to be exposed is located at the center of the capture visual field, this solution can increase the capture success rate of the point to be exposed to advance the production process and reduce the capture time, so as to reduce the production time of a single product and improve the production efficiency. In this solution, if the point to be exposed is obscure, the central point will offset during capture, and as a result, the alignment precision of the product is poor. However, by means of the operations of first confirming and adjusting the point to be exposed, adjusting the lens to focus after the point to be exposed is located at the central position of the capture visual field, and confirming that the point to be exposed is in the optimal clear state, this solution can not only improve the focus success rate to save the focus time, but also increases the capture success rate to advance the production process and reduce the capture time, so as to reduce the production time of a single product and improve the production efficiency, and it is beneficial to ensure the alignment precision of the product, and thus improving the product yield. In this solution, after the position of the light source of the exposure machine is already adjusted, the point to be exposed is captured using an automatic capture function of the exposure machine. Although the capture is not carried out in the optimal capture condition, it is still possible to successfully capture the point to be exposed and confirm the number of captures. Such operation can prevent wasting the opportunities of capture when other steps are carried out, which is beneficial to speed up the process of capture. In addition, the confirming the number of captures is beneficial to provide experience so that subsequent capture operations can learn from the operation of less number of captures to improve the capture success rate and the capture efficiency. In this solution, in consideration of the existing mode of the exposure machine on the market that a set of light sources are shared by regions to be exposed, as a result, the light source of the point to be exposed is poor, which is not conducive to the capture of the point to be exposed and prolongs the pitch time of exposure; using the same set of light sources will cause the brightness of one of the regions to be exposed to be better, while the light effect of other regions to be exposed is poor, which will affect the product and even decline the quality of the product. However, in this solution, the mode of individually using a set of light sources in each region to be exposed can optimize the light source environment of each region to be exposed. In this way, the light sources can be sequentially adjusted for each region to be exposed, and are repeatedly adjusted to find the optimal light source of each region to be exposed. A triple standard deviation of a measurement value of the optimal light source is calculated, and when the triple standard deviation is less than 2 μm, the requirements are met, and the exposure machine completes the exposure operation. For each region to be exposed, after the optimal light source needed by each region to be exposed is found, the point to be exposed and the obscure degree would be adjusted more easily under the optimal light source, and moreover, the sharpness of the product is increased, the pitch time of the exposure machine and the alignment precision of the product are further improved, and the product yield is increased.

In this solution, if the point to be exposed is not located at the central position of the capture visual field, the time of capturing the point to be exposed would be prolonged. Therefore, by means of an operation of confirming and adjusting the point to be exposed so that the point to be exposed is located at the center of the capture visual field, this solution can increase the capture success rate of the point to be exposed to advance the production process and reduce the capture time, so as to reduce the production time of a single product and improve the production efficiency. In this solution, if the point to be exposed is obscure, the central point will offset during capture, and as a result, the alignment precision of the product is poor. However, by means of the operations of first confirming and adjusting the point to be exposed, adjusting the lens to focus after the point to be exposed is located at the central position of the capture visual field, and confirming that the point to be exposed is in the optimal clear state, this solution can not only improve the focus success rate to save the focus time, but also increases the capture success rate to advance the production process and reduce the capture time, so as to reduce the production time of a single product and improve the production efficiency, and it is beneficial to ensure the alignment precision of the product, and thus improving the product yield. In this solution, after the position of the light source of the exposure machine is already adjusted, the point to be exposed is captured using an automatic capture function of the exposure machine. Although the capture is not carried out in the optimal capture condition, it is still possible to successfully capture the point to be exposed and confirm the number of captures. Such operation can prevent wasting the opportunities of capture when other steps are carried out, which is beneficial to speed up the process of capture. In addition, the confirming the number of captures is beneficial to provide experience so that subsequent capture operations can learn from the operation of less number of captures to improve the capture success rate and the capture efficiency. In this solution, in consideration of the existing mode of the exposure machine on the market that a set of light sources are shared by regions to be exposed, as a result, the light source of the point to be exposed is poor; which is not conducive to the capture of the point to be exposed and prolongs the pitch time of exposure; using the same set of light sources will cause the brightness of one of the regions to be exposed to be better, while the light effect of other regions to be exposed is poor, which will affect the product and even decline the quality of the product. However, in this solution, the mode of individually using a set of light sources in each region to be exposed can optimize the light source environment of each region to be exposed. In this way, the light sources can be sequentially adjusted for each region to be exposed, and are repeatedly adjusted to find the optimal light source of each region to be exposed. A triple standard deviation of a measurement value of the optimal light source is calculated, and when the triple standard deviation is less than 2, the requirements are met, and the exposure machine completes the exposure operation. For each region to be exposed, after the optimal light source needed by each region to be exposed is found, the point to be exposed and the obscure degree would be adjusted more easily under the optimal light source, and moreover, the sharpness of the product is increased, the pitch time of the exposure machine and the alignment precision of the product are further improved, and the product yield is increased.

The present disclosure further provides an exposure device for the manufacturing process of a display panel, including:

a confirming member, configured to confirm a position of a point to be exposed in a region to be exposed;

a capture member, configured to capture the point to be exposed and confirm that the point to be exposed is successfully captured;

a light source adjustment member, configured to adjust a light source corresponding to the successfully captured point to be exposed to an adaptive position; and an exposure machine, configured to complete an exposure operation after the light source of the point to be exposed is adjusted to the adaptive position.

In this solution, the confirming member confirms a position of the point to be exposed in the region to be exposed and then captures the point to be exposed; if the point to be exposed is directly captured without confirming and adjusting the position of the point to be exposed, the capture would easily fails, or even the pitch time of exposure is increased, as a result, less products can be processed by the exposure machine within a unit time, affecting the production efficiency of the exposure machine. This solution first captures the point to be exposed through the capture member and confirms that the point to be exposed is successfully captured, and then adjusts the light source to the adaptive position through the light source adjustment member. In this way, the exposure machine performs the exposure operation after the step of adjusting the light source. Such operation can reduce the pitch time of exposure of a single product and prevent the occurrence of underexposure or overexposure, so as to improve the alignment precision of the product, increase the product output within the unit time, and increase the production efficiency.

Optionally, the confirming member is configured to confirm that the point to be exposed is located at a central position of a capture visual field; and adjust, after the point to be exposed is located at the central position of the capture visual field, a lens to focus if the point to be exposed is displayed obscurely until the point to be exposed is displayed in an optimal clear state; and the capture member is configured to control the lens to attempt to automatically capture the point to be exposed, confirm successful capture, capture the point to be exposed for many times, and confirm the number of captures.

In this solution, if the point to be exposed is not located at the central position of the capture visual field, the time of capturing the point to be exposed would be prolonged. Therefore, by means of an operation of confirming and adjusting the point to be exposed through the confirming member so that the point to be exposed is located at the center of the capture visual field, this solution can increase the capture success rate of the point to be exposed to advance the production process and reduce the capture time, so as to reduce the production time of a single product and improve the production efficiency. In this solution, if the point to be exposed is obscure, the central point will offset during capture, and as a result, the alignment precision of the product is poor. However, this solution confirms and adjusts the point to be exposed through the confirming member, adjusts the lens to focus after the point to be exposed is located at the central position of the capture visual field, and confirms that the point to be exposed is in the optimal clear state, such solution can not only improve the focus success rate to save the focus time, but also increases the capture success rate to advance the production process and reduce the capture time, so as to reduce the production time of a single product and improve the production efficiency, and it is beneficial to ensure the alignment precision of the product, and thus improving the product yield. After the position of the light source of the exposure machine is already adjusted, the point to be exposed is captured using an automatic capture function of the exposure machine. Although the capture member performs capture not in the optimal capture condition, it is still possible to successfully capture the point to be exposed through the capture member. Such operation can prevent wasting the opportunities of capture when other steps are carried out, which is beneficial to speed up the capture process of the capture member. In addition, the confirming the number of captures of the capture member is beneficial to provide experience so that subsequent capture operations can learn from the operation of less number of captures to improve the capture success rate and the capture efficiency.

Optionally, the light source adjustment member is configured to individually configure a set of light sources for each region to be exposed, sequentially adjust the light sources for each region to be exposed, repeatedly adjust to find the optimal light source, and calculate a triple standard deviation of a measurement value of the optimal light source; and the exposure machine is configured to complete the exposure operation when it is detected that the triple standard deviation of the measurement value is less than 2 μm.

In this solution, in consideration of the existing mode of the exposure machine on the market that a set of light sources are shared by regions to be exposed, as a result, the light source of the point to be exposed is poor, which is not conducive to the capture of the point to be exposed and prolongs the pitch time of exposure; using the same set of light sources will cause the brightness of one of the regions to be exposed to be better, while the light effect of other regions to be exposed is poor, which will affect the product and even decline the quality of the product. However, in this solution, a set of light sources is individually configured for each region to be exposed through the light source adjustment member, and individually using a set of light sources in each region to be exposed can optimize the light source environment of each region to be exposed. In this way, the light sources can be sequentially adjusted for each region to be exposed, and are repeatedly adjusted to find the optimal light source of each region to be exposed. A triple standard deviation of a measurement value of the optimal light source is calculated, and when the triple standard deviation is less than 2 μm, the requirements are met, and the exposure machine completes the exposure operation. For each region to be exposed, after the optimal light source needed by each region to be exposed is found, the point to be exposed and the obscure degree would be adjusted more easily under the optimal light source, and moreover, the sharpness of the product is increased, the pitch time of the exposure machine and the alignment precision of the product are further improved, and the product yield is increased.

The present disclosure has the advantageous effects of confirming the position of the point to be exposed in the region to be exposed and then capturing the point to be exposed; if the point to be exposed is directly captured without confirming and adjusting the position of the point to be exposed, the capture would easily fails, or even the pitch time of exposure is increased, as a result, less products can be processed by the exposure machine within a unit time, affecting the production efficiency of the exposure machine. This solution first captures the point to be exposed and confirms that the point to be exposed is successfully captured, and then adjusts the light source to the adaptive position. In this way, the exposure machine performs the exposure operation after the step of adjusting the light source. Such operation can reduce the pitch time of exposure of a single product and prevent the occurrence of underexposure or overexposure, so as to improve the alignment precision of the product, increase the product output within the unit time, and increase the production efficiency.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

The specific structure and function details disclosed herein are merely representative, and are intended to describe exemplary embodiments of the present disclosure. However, the present disclosure can be specifically embodied in many alternative forms, and should not be interpreted to be limited to the embodiments described herein.

In the description of the present disclosure, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present disclosure and simplifying the description only, rather than indicating or implying that the indicated device or element must have a particular orientation or be constructed and operated in a particular orientation. Therefore, these terms should not be understood as a limitation to the present disclosure. In addition, the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of the present disclosure, "a plurality of" means two or more, unless otherwise stated. In addition, the term "include" and any variations thereof are intended to cover a non-exclusive inclusion.

In the description of the present disclosure, it should be understood that, unless otherwise specified and defined, the terms "install", "connected with", "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

The present disclosure is further described below with reference to the accompanying drawings and preferred embodiments.

Figure 1:
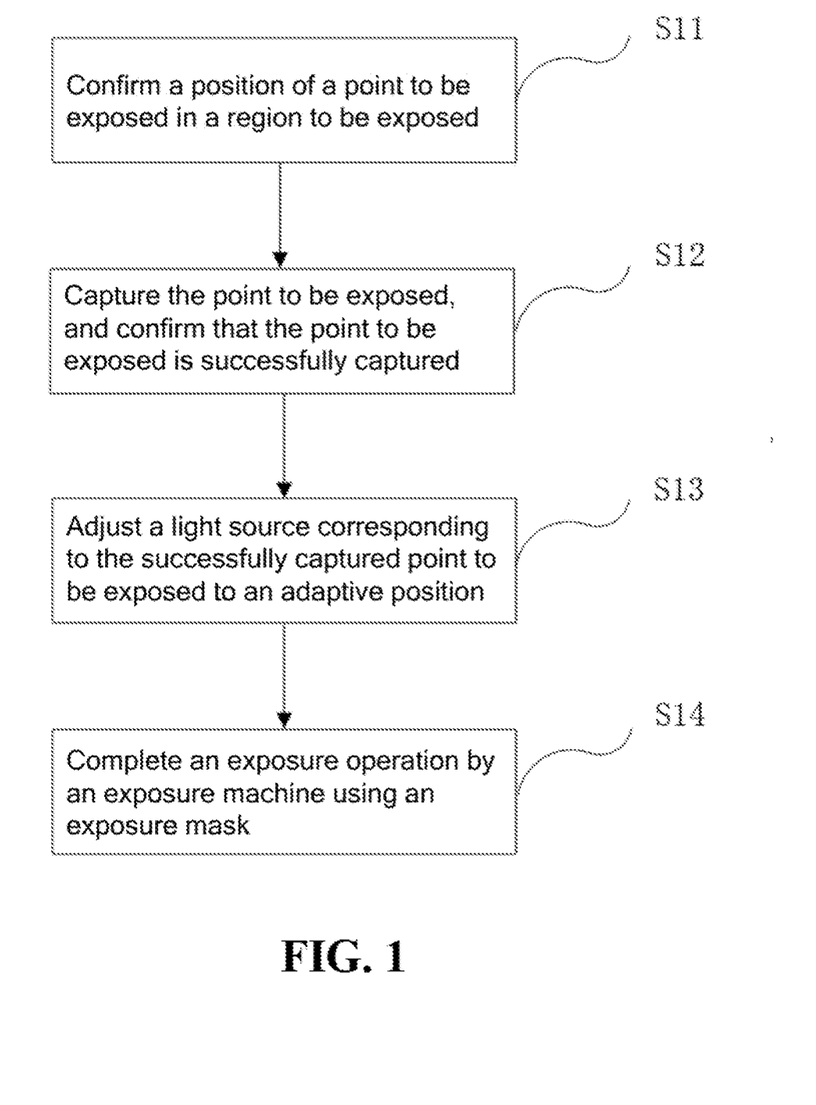
FIG. 1 is an application flowchart of an exposure method according to an embodiment of the present disclosure.
Figure 2:
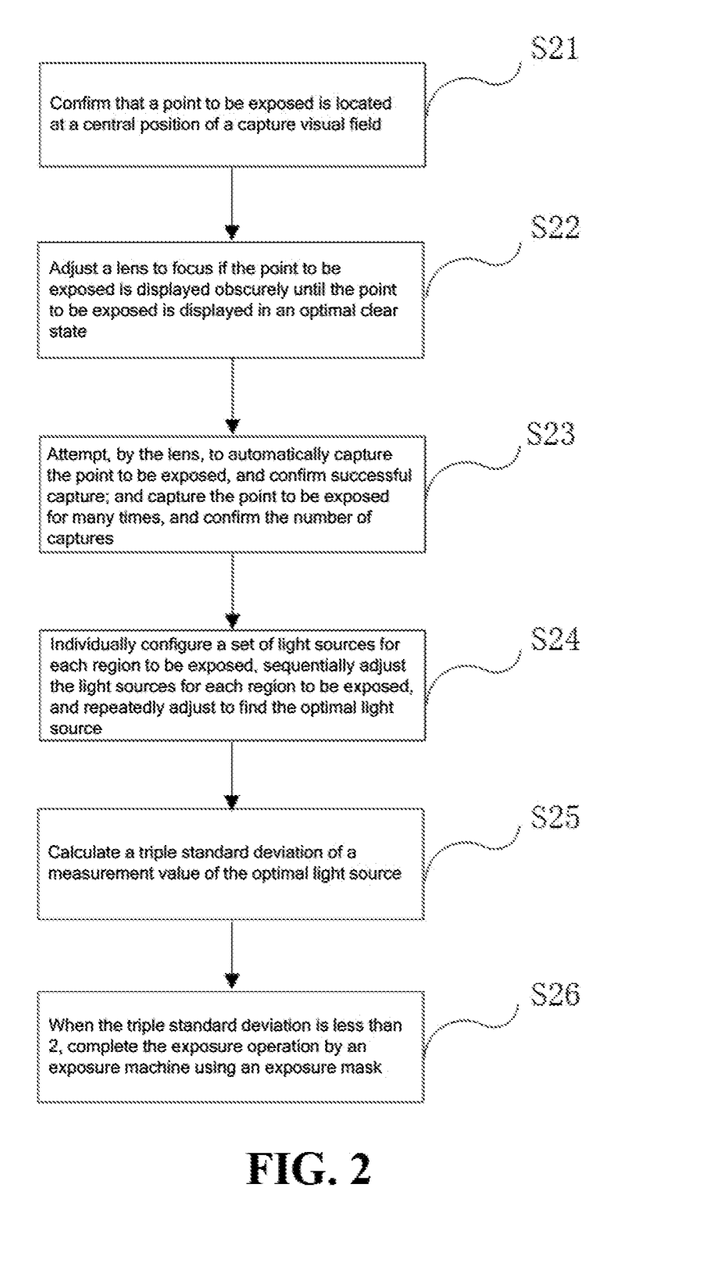
FIG. 2 is an optimal application flowchart of an exposure method according to an embodiment of the present disclosure.

As shown in FIGS. 1 and 2, an embodiment of the present disclosure discloses an exposure method, including the following steps:

S11: Confirm a position of a point to be exposed in a region to be exposed.

S12: Capture the point to be exposed, and confirming that the point to be exposed is successfully captured.

S13: Adjust a light source corresponding to the successfully captured point to be exposed to an adaptive position.

S14: Complete an exposure operation by an exposure machine.

The position of the point to be exposed in the region to be exposed is confirmed, and then the point to be exposed is captured; if the point to be exposed is directly captured without confirming and adjusting the position of the point to be exposed, the capture would easily fails, or even the pitch time of exposure is increased, as a result, less products can be processed by the exposure machine within a unit time, affecting the production efficiency of the exposure machine. This solution captures the point to be exposed and confirms that the point to be exposed is successfully captured, and then adjusts the light source to the adaptive position. In this way, the exposure machine performs the exposure operation after the step of adjusting the light source. Such operation can reduce the pitch time of exposure of a single product and prevent the occurrence of underexposure or overexposure, so as to improve the alignment precision of the product, increase the product output within the unit time, and increase the production efficiency.

Optionally, the step S11 of confirming a position of a point to be exposed in a region to be exposed includes:

S21: Confirm that the point to be exposed is located at a central position of a capture visual field.

In this solution, if the point to be exposed is not located at the central position of the capture visual field, the time of capturing the point to be exposed would be prolonged. Therefore, by means of an operation of confirming and adjusting the point to be exposed so that the point to be exposed is located at the center of the capture visual field, this solution can increase the capture success rate of the point to be exposed to advance the production process and reduce the capture time, so as to reduce the production time of a single product and improve the production efficiency.

Optionally, the step S11 of confirming a position of a point to be exposed in a region to be exposed further includes:

S22: After confirming that the point to be exposed is located at the central position of the capture visual field, adjust a lens to focus if the point to be exposed is displayed obscurely until the point to be exposed is displayed in an optimal clear state.

In this solution, if the point to be exposed is obscure, the central point will offset during capture, and as a result, the alignment precision of the product is poor. However, by means of the operations of first confirming and adjusting the point to be exposed, adjusting the lens to focus after the point to be exposed is located at the central position of the capture visual field, and confirming that the point to be exposed is in the optimal clear state, this solution can not only improve the focus success rate to save the focus time, but also increases the capture success rate to advance the production process and reduce the capture time, so as to reduce the production time of a single product and improve the production efficiency, and it is beneficial to ensure the alignment precision of the product, and thus improving the product yield.

Optionally, the step S12 of capturing the point to be exposed, and confirming that the point to be exposed is successfully captured further includes:

S23: Attempt, by the lens, to automatically capture the point to be exposed, and confirm successful capture.

Capture the point to be exposed for many times, and confirm the number of captures.

In this solution, after the position of the light source of the exposure machine is already adjusted, the point to be exposed is captured using an automatic capture function of the exposure machine. Although the capture is not carried out in the optimal capture condition, it is still possible to successfully capture the point to be exposed. Such operation can prevent wasting the opportunities of capture when other steps are carried out, which is beneficial to speed up the process of capture. In addition, the confirming the number of captures is beneficial to provide experience so that subsequent capture operations can learn from the operation of less number of captures to improve the capture success rate and the capture efficiency.

Optionally, the step S13 of adjusting a light source corresponding to the successfully captured point to be exposed to an adaptive position further includes:

S24: Individually configure a set of light sources for each region to be exposed, sequentially adjust the light sources for each region to be exposed, and repeatedly adjust to find the optimal light source.

S25: Calculate a triple standard deviation of a measurement value of the optimal light source.

S26: When the triple standard deviation is less than 2 μm, complete an exposure operation by the exposure machine.

In this solution, in consideration of the existing mode of the exposure machine on the market that a set of light sources are shared by regions to be exposed, as a result, the light source of the point to be exposed is poor, which is not conducive to the capture of the point to be exposed and prolongs the pitch time of exposure; using the same set of light sources will cause the brightness of one of the regions to be exposed to be better, while the light effect of other regions to be exposed is poor, which will affect the product and even decline the quality of the product. However, in this solution, the mode of individually using a set of light sources in each region to be exposed can optimize the light source environment of each region to be exposed. In this way, the light sources can be sequentially adjusted for each region to be exposed, and are repeatedly adjusted to find the optimal light source of each region to be exposed. A triple standard deviation of a measurement value of the optimal light source is calculated, and when the triple standard deviation is less than 2 μm, the requirements are met, and the exposure machine completes the exposure operation. For each region to be exposed, after the optimal light source needed by each region to be exposed is found, the point to be exposed and the obscure degree would be adjusted more easily under the optimal light source, and moreover, the sharpness of the product is increased, the pitch time of the exposure machine and the alignment precision of the product are further improved, and the product yield is increased.

Optionally, the region to be exposed is a region on a substrate corresponding to the size of the exposure mask; and the substrate is divided into at least two regions to be exposed.

In this solution, the region to be exposed is a region on a substrate corresponding to the size of the exposure mask; the substrates have different sizes according to the design of the mask; the substrate is divided into at least two regions to be exposed; all the regions to be exposed constitute the entire substrate; the light sources are adjusted for each region to be exposed so that the parts of the substrate are perfected so that the entire substrate is exposed better after the exposure operation is completed.

Optionally, the substrate is divided into six regions to be exposed.

In this solution, the substrate is divided into six regions to be exposed; and the six regions to be exposed constitute an entire substrate. Dividing a substrate into six regions to be exposed enables the light source to be adjusted accurately, and therefore, the light irradiation is concentrated, and the entire substrate is exposed better after the exposure operation is completed.

As another embodiment of this disclosure, with reference to FIG. 2, disclosed is another exposure method, including:

S21: Confirm that a point to be exposed is located at a central position of a capture visual field.

S22: After confirming that the point to be exposed is located at the central position of the capture visual field, adjust a lens to focus if the point to be exposed is displayed obscurely until the point to be exposed is displayed in an optimal clear state.

S23: Attempt, by the lens, to automatically capture the point to be exposed, and confirm successful capture.

Capture the point to be exposed for many times, and confirm the number of captures;

S24: Individually configure a set of light sources for each region to be exposed, sequentially adjust the light sources for each region to be exposed.

Repeatedly adjust to find the optimal light source.

S25: Calculate a triple standard deviation of a measurement value of the optimal light source.

S26: When the triple standard deviation is less than 2 μm, complete an exposure operation by the exposure machine.

In this solution, if the point to be exposed is not located at the central position of the capture visual field, the time of capturing the point to be exposed would be prolonged. Therefore, by means of an operation of confirming and adjusting the point to be exposed so that the point to be exposed is located at the center of the capture visual field, this solution can increase the capture success rate of the point to be exposed to advance the production process and reduce the capture time, so as to reduce the production time of a single product and improve the production efficiency. In this solution, if the point to be exposed is obscure, the central point will offset during capture, and as a result, the alignment precision of the product is poor. However, by means of the operations of first confirming and adjusting the point to be exposed, adjusting the lens to focus after the point to be exposed is located at the central position of the capture visual field, and confirming that the point to be exposed is in the optimal clear state, this solution can not only improve the focus success rate to save the focus time, but also increases the capture success rate to advance the production process and reduce the capture time, so as to reduce the production time of a single product and improve the production efficiency, and it is beneficial to ensure the alignment precision of the product, and thus improving the product yield. In this solution, after the position of the light source of the exposure machine is already adjusted, the point to be exposed is captured using an automatic capture function of the exposure machine. Although the capture is not carried out in the optimal capture condition, it is still possible to successfully capture the point to be exposed and confirm the number of captures. Such operation can prevent wasting the opportunities of capture when other steps are carried out, which is beneficial to speed up the process of capture. In addition, the confirming the number of captures is beneficial to provide experience so that subsequent capture operations can learn from the operation of less number of captures to improve the capture success rate and the capture efficiency. In this solution, in consideration of the existing mode of the exposure machine on the market that a set of light sources are shared by regions to be exposed, as a result, the light source of the point to be exposed is poor, which is not conducive to the capture of the point to be exposed and prolongs the pitch time of exposure; using the same set of light sources will cause the brightness of one of the regions to be exposed to be better, while the light effect of other regions to be exposed is poor, which will affect the product and even decline the quality of the product. However, in this solution, the mode of individually using a set of light sources in each region to be exposed can optimize the light source environment of each region to be exposed. In this way, the light sources can be sequentially adjusted for each region to be exposed, and are repeatedly adjusted to find the optimal light source of each region to be exposed. A triple standard deviation of a measurement value of the optimal light source is calculated, and when the triple standard deviation is less than 2 μm, the requirements are met, and the exposure machine completes the exposure operation. For each region to be exposed, after the optimal light source needed by each region to be exposed is found, the point to be exposed and the obscure degree would be adjusted more easily under the optimal light source, and moreover, the sharpness of the product is increased, the pitch time of the exposure machine and the alignment precision of the product are further improved, and the product yield is increased.

Figure 3:
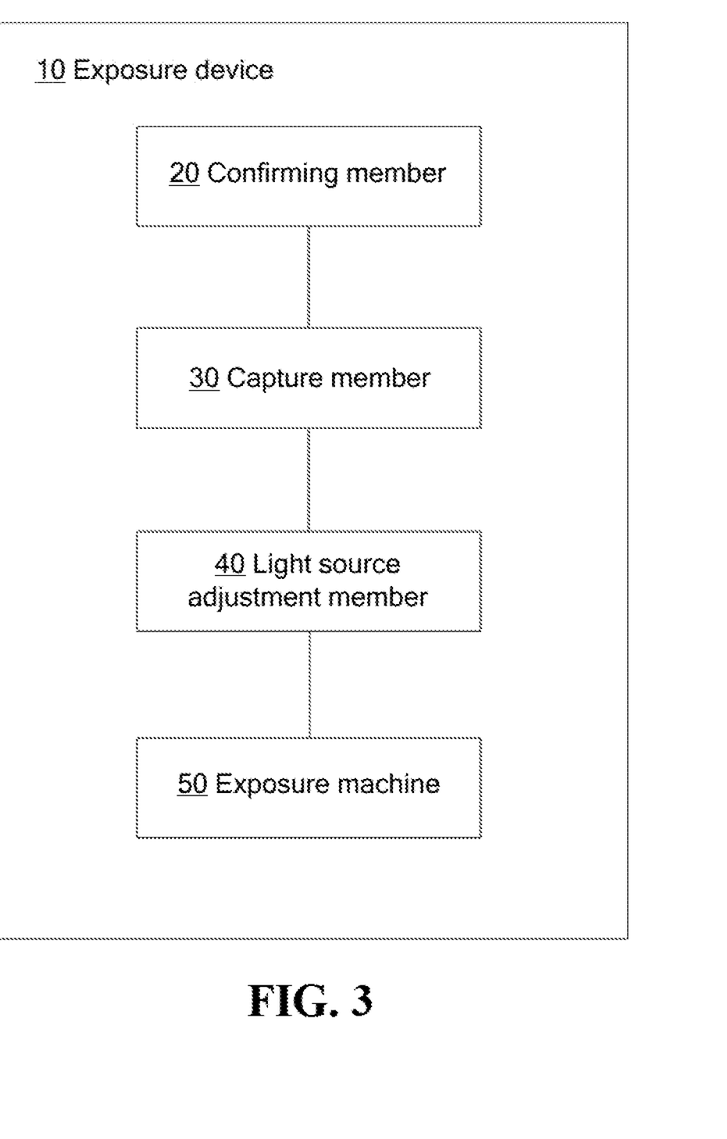
FIG. 3 is a schematic diagram of an exposure device for the manufacturing process of a display panel according to an embodiment of the present disclosure.
Figure 4:
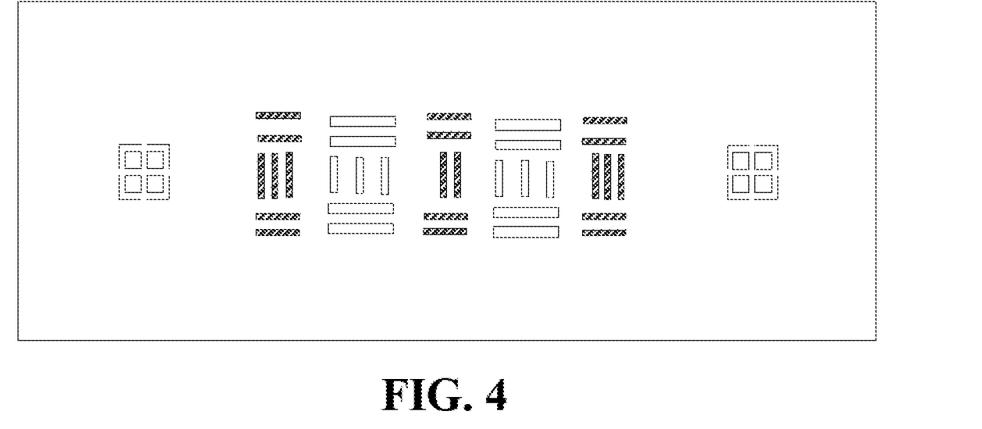
FIG. 4 is a schematic diagram of a point to be exposed of a display region prior to adjustment according to an embodiment of the present disclosure.
Figure 5:
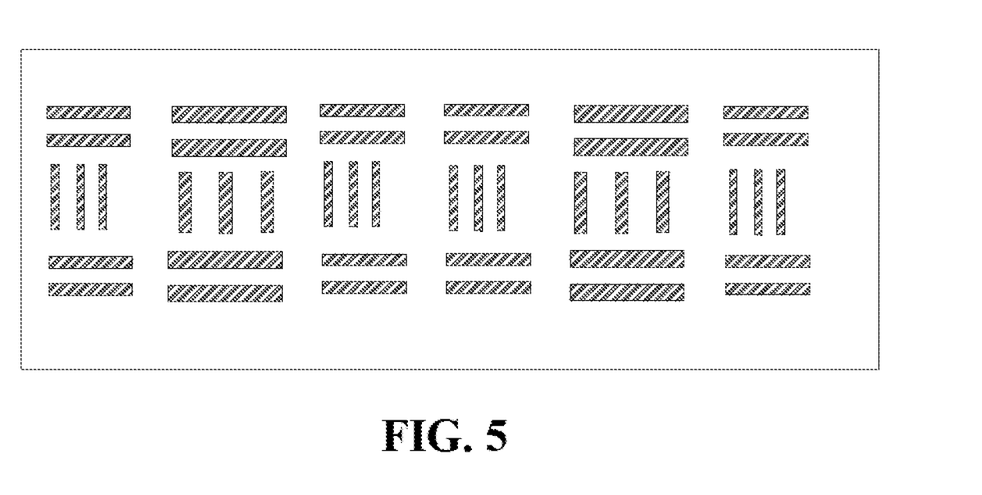
FIG. 5 is a schematic diagram of a point to be exposed of good sharpness before capture prior to adjustment according to an embodiment of the present disclosure.
Figure 6:
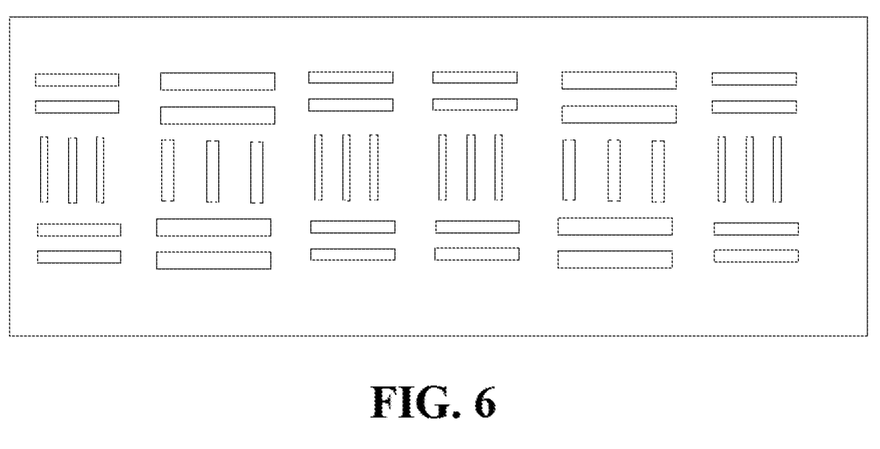
FIG. 6 is a schematic diagram of a point to be exposed of good sharpness before capture after adjustment according to an embodiment of the present disclosure.

As another embodiment of the present disclosure, with reference to FIG. 3, disclosed is an exposure device 10, including:

a confirming member 20, configured to confirm a position of a point to be exposed in a region to be exposed;

a capture member 30, configured to capture the point to be exposed and confirm that the point to be exposed is successfully captured;

a light source adjustment member 40, configured to adjust a light source corresponding to the successfully captured point to be exposed to an adaptive position; and an exposure machine 50, configured to complete an exposure operation after the light source of the point to be exposed is adjusted to the adaptive position.

In this solution, the confirming member confirms a position of the point to be exposed in the region to be exposed and then captures the point to be exposed; if the point to be exposed is directly captured without confirming and adjusting the position of the point to be exposed, the capture would easily fails, or even the pitch time of exposure is increased, as a result, less products can be processed by the exposure machine within a unit time, affecting the production efficiency of the exposure machine. This solution first captures the point to be exposed through the capture member and confirms that the point to be exposed is successfully captured, and then adjusts the light source to the adaptive position through the light source adjustment member. In this way, the exposure machine performs the exposure operation after the step of adjusting the light source. Such operation can reduce the pitch time of exposure of a single product and prevent the occurrence of underexposure or overexposure, so as to improve the alignment precision of the product, increase the product output within the unit time, and increase the production efficiency.

Optionally, the confirming member 20 is configured to confirm that the point to be exposed is located at a central position of a capture visual field; and adjust, after the point to be exposed is located at the central position of the capture visual field, a lens to focus if the point to be exposed is displayed obscurely until the point to be exposed is displayed in an optimal clear state; and the capture member 30 is configured to control the lens to attempt to automatically capture the point to be exposed, confirm successful capture, capture the point to be exposed for many times, and confirm the number of captures.

In this solution, if the point to be exposed is not located at the central position of the capture visual field, the time of capturing the point to be exposed would be prolonged. Therefore, by means of an operation of confirming and adjusting the point to be exposed through the confirming member 20 so that the point to be exposed is located at the center of the capture visual field, this solution can increase the capture success rate of the point to be exposed to advance the production process and reduce the capture time, so as to reduce the production time of a single product and improve the production efficiency. In this solution, if the point to be exposed is obscure, the central point will offset during capture, and as a result, the alignment precision of the product is poor. However, this solution confirms and adjusts the point to be exposed through the confirming member 20, adjusts the lens to focus after the point to be exposed is located at the central position of the capture visual field, and confirms that the point to be exposed is in the optimal clear state, such solution can not only improve the focus success rate to save the focus time, but also increases the capture success rate to advance the production process and reduce the capture time, so as to reduce the production time of a single product and improve the production efficiency, and it is beneficial to ensure the alignment precision of the product, and thus improving the product yield. After the position of the light source of the exposure machine is already adjusted, the point to be exposed is captured using an automatic capture function of the exposure machine. Although the capture member 30 performs capture not in the optimal capture condition, it is still possible to successfully capture the point to be exposed through the capture member 30. Such operation can prevent wasting the opportunities of capture when other steps are carried out, which is beneficial to speed up the capture process of the capture member 30. In addition, the confirming the number of captures of the capture member 30 is beneficial to provide experience so that subsequent capture operations can learn from the operation of less number of captures to improve the capture success rate and the capture efficiency.

Optionally, the light source adjustment member 40 is configured to individually configure a set of light sources for each region to be exposed, sequentially adjust the light sources for each region to be exposed, repeatedly adjust to find the optimal light source, and calculate a triple standard deviation of a measurement value of the optimal light source; and the exposure machine 50 is configured to complete the exposure operation when it is detected that the triple standard deviation of the measurement value is less than 2 μm.

In this solution, in consideration of the existing mode of the exposure machine on the market that a set of light sources are shared by regions to be exposed, as a result, the light source of the point to be exposed is poor, which is not conducive to the capture of the point to be exposed and prolongs the pitch time of exposure; using the same set of light sources will cause the brightness of one of the regions to be exposed to be better, while the light effect of other regions to be exposed is poor, which will affect the product and even decline the quality of the product. However, in this solution, a set of light sources is individually configured for each region to be exposed through the light source adjustment member 40, and individually using a set of light sources in each region to be exposed can optimize the light source environment of each region to be exposed. In this way, the light sources can be sequentially adjusted for each region to be exposed, and are repeatedly adjusted to find the optimal light source of each region to be exposed. A triple standard deviation of a measurement value of the optimal light source is calculated, and when the triple standard deviation is less than 2 μm, the requirements are met, and the exposure machine 50 completes the exposure operation. For each region to be exposed, after the optimal light source needed by each region to be exposed is found, the point to be exposed and the obscure degree would be adjusted more easily under the optimal light source, and moreover, the sharpness of the product is increased, the pitch time of the exposure machine and the alignment precision of the product are further improved, and the product yield is increased.

The panel in the present disclosure may be a Twisted Nematic (TN) panel, an In-Plane Switching (IPS) panel, and a Multi-domain Vertical Alignment (VA) panel, and of course, may also be other types of panels, if appropriate.

The contents above are further detailed descriptions of the present disclosure in conjunction with specific preferred embodiments, and the specific implementation of the present disclosure is not limited to these descriptions. It will be apparent to a person of ordinary skill in the art that various simple deductions or substitutions may be made without departing from the spirit of the present disclosure, and should be considered to be within the scope of protection of the present disclosure.

What is claimed is:

1. An exposure method, comprising:
   confirming a position of a point to be exposed in a region to be exposed;
   capturing the point to be exposed, and confirming that the point to be exposed is successfully captured;

adjusting a light source corresponding to the successfully captured point to be exposed to an adaptive position; and completing an exposure operation by an exposure machine using an exposure mask;

wherein the operation of adjusting a light source corresponding to the successfully captured point to be exposed to an adaptive position further comprises: individually configuring a set of light sources for each region to be exposed, sequentially adjusting the light sources for each region to be exposed, and repeatedly adjusting to find the optimal light source;

wherein the operation of adjusting a light source corresponding to the successfully captured point to be exposed to an adaptive position further comprises: after finding the optimal light source, calculating a triple standard deviation of a measurement value of the optimal light source.

2. The exposure method according to claim 1, wherein the operation of confirming a position of a point to be exposed in a region to be exposed comprises: confirming that the point to be exposed is located at a central position of a capture visual field.

3. The exposure method according to claim 2, wherein the operation of confirming a position of a point to be exposed in a region to be exposed further comprises: after confirming that the point to be exposed is located at the central position of the capture visual field, adjusting a lens to focus if the point to be exposed is displayed obscurely until the point to be exposed is displayed in an optimal clear state.

4. The exposure method according to claim 1, wherein the operation of capturing the point to be exposed, and confirming that the point to be exposed is successfully captured further comprises: attempting, by a lens, to automatically capture the point to be exposed, and confirming successful capture; and capturing the point to be exposed for many times, and confirming the number of captures.

5. The exposure method according to claim 1, wherein the operation of adjusting a light source corresponding to the successfully captured point to be exposed to an adaptive position further comprises: when the triple standard deviation is less than 2 μm, completing the exposure operation by the exposure machine using an exposure mask.

6. The exposure method according to claim 1, wherein the region to be exposed is a region on a substrate corresponding to the size of the exposure mask.

7. The exposure method according to claim 6, wherein the substrate is divided into at least two regions to be exposed.

8. An exposure method, comprising:
confirming that a point to be exposed is located at a central position of a capture visual field;
after confirming that the point to be exposed is located at the central position of the capture visual field, adjusting a lens to focus if the point to be exposed is displayed obscurely until the point to be exposed is displayed in an optimal clear state;
attempting, by the lens, to automatically capture the point to be exposed, and confirming successful capture;
capturing the point to be exposed for many times, and confirming the number of captures;

individually configuring a set of light sources for each region to be exposed, sequentially adjusting the light sources for each region to be exposed, and repeatedly adjusting to find the optimal light source;
calculating a triple standard deviation of a measurement value of the optimal light source; and
when the triple standard deviation is less than 2 μm, completing an exposure operation by the exposure machine using an exposure mask.

9. An exposure device, comprising at least one processor and a non-transitory computer-readable storage medium coupled to the at least one processor, the non-transitory computer-readable storage medium storing program instructions that when executed by the at least one processor cause the exposure device to perform associated operations, the program instructions comprising:
a confirming member, configured to confirm a position of a point to be exposed in a region to be exposed;
a capture member, configured to capture the point to be exposed and confirm that the point to be exposed is successfully captured;
a light source adjustment member, configured to adjust a light source corresponding to the successfully captured point to be exposed to an adaptive position; and
the exposure device further comprises an exposure machine configured to complete an exposure operation after the light source of the point to be exposed is adjusted to the adaptive position;
wherein the light source adjustment member is configured to individually configure a set of light sources for each region to be exposed, sequentially adjust the light sources for each region to be exposed, repeatedly adjust to find the optimal light source, and calculate a triple standard deviation of a measurement value of the optimal light source.

10. The exposure device according to claim 9, wherein the confirming member is configured to confirm that the point to be exposed is located at a central position of a capture visual field.

11. The exposure device according to claim 10, wherein the confirming member is configured to adjust, after confirming that the point to be exposed is located at the central position of the capture visual field, a lens to focus if the point to be exposed is displayed obscurely until the point to be exposed is displayed in an optimal clear state.

12. The exposure device according to claim 9, wherein the capture member is configured to control a lens to attempt to automatically capture the point to be exposed, and confirm successful capture.

13. The exposure device according to claim 12, wherein the capture member is configured to confirm successful capture, capture the point to be exposed for many times, and confirm the number of captures.

14. The exposure device according to claim 9, wherein in response to detecting that the triple standard deviation of the measurement value is less than 2 μm, the exposure machine is configured to complete the exposure operation.

* * * * *